United States Patent [19]

Miyamoto et al.

[11] Patent Number: 5,025,417
[45] Date of Patent: Jun. 18, 1991

[54] SEMICONDUCTOR MEMORY DEVICE CAPABLE OF PREVENTING DATA OF NON-SELECTED MEMORY CELL FROM BEING DEGRADED

[75] Inventors: Junichi Miyamoto; Nobuaki Ohtsuka, both of Yokohama; Kuniyoshi Yoshikawa; Seiichi Mori, both of Tokyo, all of Japan

[73] Assignee: Kabushiki Kaisha Toshiba, Kawasaki, Japan

[21] Appl. No.: 444,998

[22] Filed: Dec. 4, 1989

[30] Foreign Application Priority Data

Jan. 13, 1989 [JP] Japan .................................. 1-6213

[51] Int. Cl.⁵ ........................ G11C 11/40; G11C 13/00
[52] U.S. Cl. .............................. 365/189.09; 365/185; 365/227
[58] Field of Search ............ 365/185, 226, 227, 189.09

[56] References Cited

PUBLICATIONS

Kayama et al., "A 100ns 4Mbit (512K×8 bit) CMOS EPROM," Digest of ESSCIRC '88, pp. 23-25 (Sep. 1988).

Primary Examiner—Terrell W. Fears
Attorney, Agent, or Firm—Finnegan, Henderson, Farabow, Garrett and Dunner

[57] ABSTRACT

A semiconductor memory device includes a first power source terminal supplied with a first power source voltage for data readout, a second power source terminal supplied with a second power source voltage for data write-in, memory cells formed of a floating gate type MOS transistor, a voltage switching circuit for selectively outputting one of the first and second power source voltages supplied to the first and second power source terminals, a voltage lowering circuit for lowering the second power source voltage supplied to the second power source terminal and outputting the lowered voltage, a gate potential control circuit connected to receive an output voltage of the voltage switching circuit as a power source voltage and supplies an output to the gate of the memory cell, and a drain potential control circuit connected to receive an output voltage of the voltage lowering circuit as a power source voltage and supplies an output to the drain of the memory cell. The second power source voltage for data write-in supplied to the second power source terminal is lowered by the power source voltage lowering circuit and is then supplied to the drain of the memory cell via the drain potential control circuit.

13 Claims, 5 Drawing Sheets

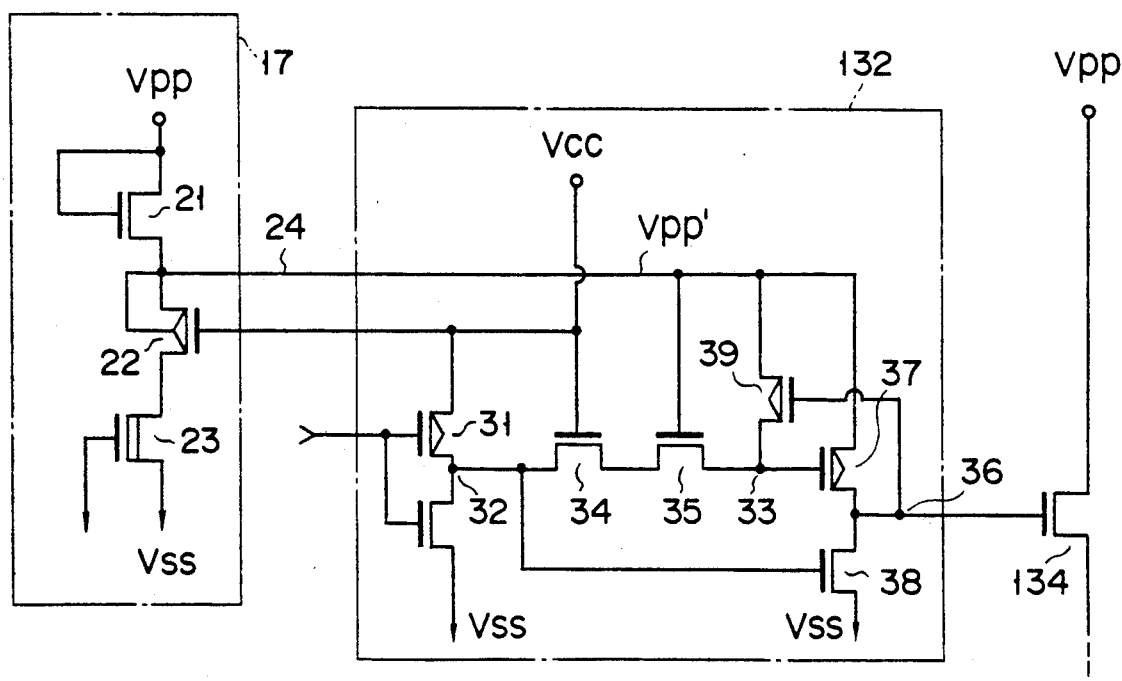
F I G. 6

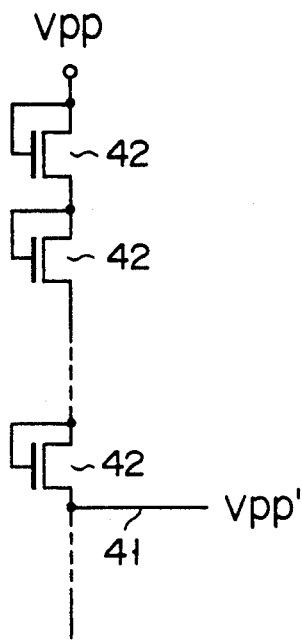
F I G. 7
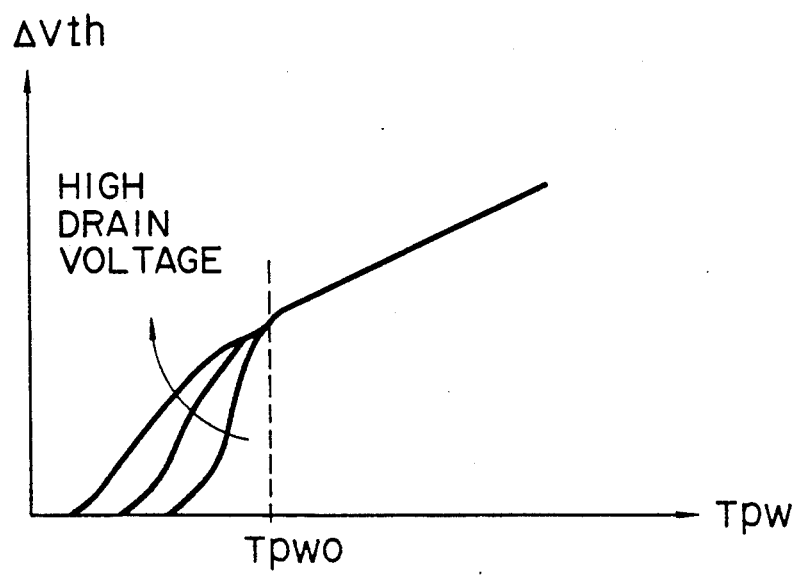
F I G. 8

SEMICONDUCTOR MEMORY DEVICE CAPABLE OF PREVENTING DATA OF NON-SELECTED MEMORY CELL FROM BEING DEGRADED

BACKGROUND OF THE INVENTION

1. Field of the Invention

This invention relates to a semiconductor memory device, and more particularly to a semiconductor memory device capable of preventing data of a non-selected memory cell from being degraded.

2. Description of the Related Art

FIG. 1 shows the schematic construction of a conventional semiconductor memory device, for example, a conventional electrically data programmable nonvolatile semiconductor memory (EPROM). In FIG. 1, memory cells MC1 to MCn are each formed of a nonvolatile transistor. FIG. 2 is a cross sectional view showing the construction of memory cell MC1. Source 72 and drain 73 formed of n+-type diffusion regions are formed in the surface area of p-type substrate 71, floating gate 74 is formed above that portion of the substrate which lies between the source and drain, and control gate 75 is formed above the floating gate. The film thickness of that portion of insulation film 76 which lies between substrate 71 and floating gate 74 is set to tox1 and the film thickness of that portion of insulation film 76 which lies between floating gate 74 and control gate 75 is set to tox2.

Since the EPROM is a nonvolatile memory, data programmed into memory cell MC1 can be permanently stored unless all the stored data is erased by application of ultraviolet rays. In this case, the "data programming" means that electrons are injected into floating gate 74 of memory cell MC1 and data of the memory cell is set to "0". That is, memory cell MC1 having data of "1" is not programmed and set in the erasing state in which no electron is injected into floating gate 74. For this reason, in order to program data into the memory cell, high voltage Vpp of 12.5 V, for example, is simultaneously applied to drain 73 and control gate 75 of the memory cell which is desired to store data "0", thereby causing hot electrons to be injected into the floating gate from the channel. As a result, the threshold voltage of the programmed memory cell transistor is raised and thus data is programmed into memory cell MC1 of the EPROM. The programming operation is effected by use of an exclusive-use device which is called an EPROM writer. The EPROM is mounted on a device using the EPROM after the programming operation.

In the readout mode, voltage Vcc of 5 V, for example, is applied to control gate 75 to read out data stored in memory cell MC1.

As described above, in the EPROM, the level of a voltage applied to control gate 75 when data is programmed into data storing memory cell MC1 is different from that applied when data is read out from the memory cell. For example, voltage Vcc (5 V) is applied in the data readout operation, and voltage Vpp (12.5 V) is applied in the data programming operation. Therefore, it is necessary to provide a switching circuit for switching voltages Vcc and Vpp in addition to externally supplied power source voltages Vcc (5 V), Vpp (12.5 V) and Vss (0 V).

Referring to FIG. 1 again, the switching between voltages Vcc and Vpp is effected by use of voltage switching circuit 102. Switching circuit 102 is supplied with normal data readout voltage Vcc via terminal 142 and data programming high voltage Vpp via terminal 144 and selectively supplies voltage Vcc or Vpp as voltage SW according to an programming control signal (write enable signal). Voltage Vpp is also supplied to programming control section 104. Programming control section 104 includes transistor 134 whose drain and source are respectively connected to terminal 144 and column selection gate circuit 108 and programming control buffer 132 connected to receive voltage Vpp as a power source voltage is connected to a gate of the transistor 134 to control the gate voltage of transistor 134 according to programming data Din.

Column decoder 106 decodes a column address included in the input address to output the decoded result to column selection gate circuit 108. Circuit 108 includes a plurality of N-channel MOS transistors and selects memory cell MC1 based on the decoded result of decoder 106. Row decoder 110 decodes a row address included in the input address to output the decoded result to row address buffer 112. Buffer 112 is supplied with voltage SW from circuit 102 as the power source voltage and supplies a voltage to control gate 75 of memory cell MC1.

The drain and source of memory cell MC1 are respectively connected to bit line 120 and ground voltage terminal Vss. Bit line 120 is connected to one input terminal of sense amplifier 116 via a plurality of transistors of column selection gate circuit 108. Sense amplifier 116 senses "1" or "0" of data stored in memory cell MC1 by comparing the potential of bit line 120 varying according to data stored in one of memory cells MC1 selected by row decoder 110 and column decoder 106 with an input reference voltage to be described later.

Reference voltage generation circuit 122 supplies a reference voltage to sense amplifier 116. Circuit 122 includes dummy cell DC constructed by the same nonvolatile transistor as memory cell MC1, dummy bit line 118 and column selection gate circuit 114 having normally turned-on transistors of the same number as the transistors series-connected in column selection gate circuit 108. The level of the reference voltage is determined by turning on dummy cell DC. In order to obtain a stable reference potential, it is necessary to design the transistor characteristics of memory cell MC1 and dummy cell DC equal to each other.

With the above construction, when data is programmed into memory cell MC1, high voltage Vpp is supplied as voltage SW from power source switching circuit 102 to row address buffer circuit 112. At the same time, high voltage Vpp is supplied from programming controlling buffer 132 to the gate of programming controlling transistor 134. If the threshold voltage of transistor 134 is Vth, a voltage of (Vpp−Vth) is supplied to the drain of memory cell MC1 via column selection gate circuit 108. Further, high voltage Vpp is supplied from row address buffer 112 to the control gate of memory cell MC1. As a result, current flows in the source-drain path of memory cell MC1, causing hot electrons to be injected into floating gate 74 to raise the threshold voltage of memory cell MC1. In this way, data is programmed into memory cell MC1.

When data is read out from memory cell MC1, voltage Vcc is supplied as voltage SW from power source switching circuit 102 to row address buffer 112. At this time, voltage Vcc is supplied from row address buffer 112 to the control gate of memory cell MC1, permitting a voltage corresponding to data stored in memory cell MCl to be supplied to sense amplifier 116 via column selection gate circuit 108. A reference voltage is also supplied from reference voltage generating circuit 122 to sense amplifier 116. Then, sense amplifier 116 compares the voltage supplied from memory cell MCl with that supplied from dummy cell DC and outputs the comparison result as readout data to the data line.

FIG. 3 shows the voltage-current characteristic in a case where data is written or programmed into memory cell MCl of FIG. 1. In FIG. 3, characteristic curve a shown by a solid line indicates the characteristic of memory cell MCl itself, and characteristic curve b shown by broken lines indicates the stationary characteristic of all the transistors of column selection gate circuit 108 which are connected in series with transistor 134. In this case, intersection c between characteristic curves a and b is the operation point.

As shown in FIG. 1, a large number of memory cells are connected to a single bit line in an actual EPROM and only one of the memory cells is set into a data write-in or programming state. In other words, as shown in FIG. 1, a large number of memory cells (MCl, - - -, MCn) are connected to a single bit line 120 and outputs of row address buffers 112 are respectively applied to the control gates of the memory cells. High voltage Vpp is supplied only from that one of buffers 112 which is connected to the control gate of one of memory cells MCl to MCn to be selected and reference voltages Vss of 0 V are applied from other buffers 112. For example, when memory cell MCl is selected, high voltage Vpp is applied only to control gate 75 of memory cell MCl and reference voltages Vss are applied to the control gates of other memory cells. However, as described before, a voltage of (Vpp−Vth) is applied to the drains of all the memory cells connected to the same bit line and non-selected memory cells will receive a voltage stress due application of voltage (Vpp−Vth).

When a memory cell having data previously stored therein is subjected to the above voltage stress, electrons injected into floating gate 74 are attracted towards drain 73 and finally discharged into drain 73, lowering the threshold voltage of the memory cell and degrading data stored therein. This phenomenon is called a "drain-through" phenomenon.

FIG. 4 is a characteristic diagram showing the relation between electric field EDF between the drain and floating gate of a memory cell and the ratio of variation ΔVth in the threshold voltage to initial threshold voltage Vth with application time of the voltage stress being used as a parameter. As shown in FIG. 4, as the drain voltage becomes higher and the intensity of electric field EDF between the drain and floating gate becomes higher, or as stress application time becomes longer, then a larger amount of electrons may be emitted, increasing variation ΔVth in the threshold voltage. Therefore, in order to suppress the "drain-through" phenomenon, it is necessary to reduce the stress application time or suppress the electric field between the drain and floating gate of the non-selected memory cell. However, since the stress application time is determined by the product (n·Tpw) of data programming time Tpw for each memory cell and the number n of memory cells connected to the same bit line, there is a limit in reducing the time. On the other hand, in order to suppress the electric field between the drain and floating gate of the memory cell, film thickness tox1 of insulation film 76 in FIG. 2 may be increased to separate drain 73 from floating gate 74 by a longer distance. However, if film thickness tox1 of the insulation film is increased, the conductance of the memory cell in the read mode is reduced, lowering the data readout speed and making the write-in or programming time longer.

As described above, the readout speed and write-in or programming speed may be lowered when an attempt is made to prevent data of non-selected memory cells from being deteriorated by the voltage stress applied to the non-selected memory cells which are not selected in the data write-in or programming mode.

SUMMARY OF THE INVENTION

This invention has been made in view of the above consideration, and an object of this invention is to provide a semiconductor memory device capable of preventing data of non-selected memory cells from being degraded by application of voltage stress without lowering the readout and write-in speeds.

In order to achieve the above object, a semiconductor memory device includes a memory cell constructed by a MOS transistor having a floating gate, a control gate and a drain, for storing data; a power source switching circuit for selectively supplying one of first and second power source voltages according to an input write-in control signal; a gate potential control circuit connected to receive an output voltage of the power source switching circuit as a power source voltage, for supplying an output to the control gate of the memory cell; a drain potential control circuit connected to receive a lowered voltage as a power source voltage, for supplying an output to the drain of the memory cell; and a power source voltage lowering circuit for supplying a voltage which is obtained by lowering the second voltage by a preset voltage to the drain potential control circuit.

In order to attain the above object, a method for preventing data stored in a non-selected memory cell from being degraded in a semiconductor memory device includes the steps of:

supplying a first power source voltage to the control gate of a selected one of a plurality of memory cells in the write mode;

lowering the first power source voltage by a preset voltage to obtain a lowered voltage; and supplying the lowered voltage to the drains of the plurality of memory cells.

As described above, according to this invention, a semiconductor memory device can be provided which can prevent data in a non-selected memory cell from being degraded by a voltage stress without causing the readout speed and write-in speed to be lowered.

BRIEF DESCRIPTION OF THE DRAWINGS

FIG. 6 is a circuit diagram showing the construction of a voltage lowering circuit and a write-in control circuit in the embodiment shown in FIG. 5;

FIG. 7 is a circuit diagram showing another construction of the voltage lowering circuit; and FIG. 8 is a characteristic diagram for illustrating the principle of this invention.

DETAILED DESCRIPTION OF THE PREFERRED EMBODIMENTS

Figure 1:
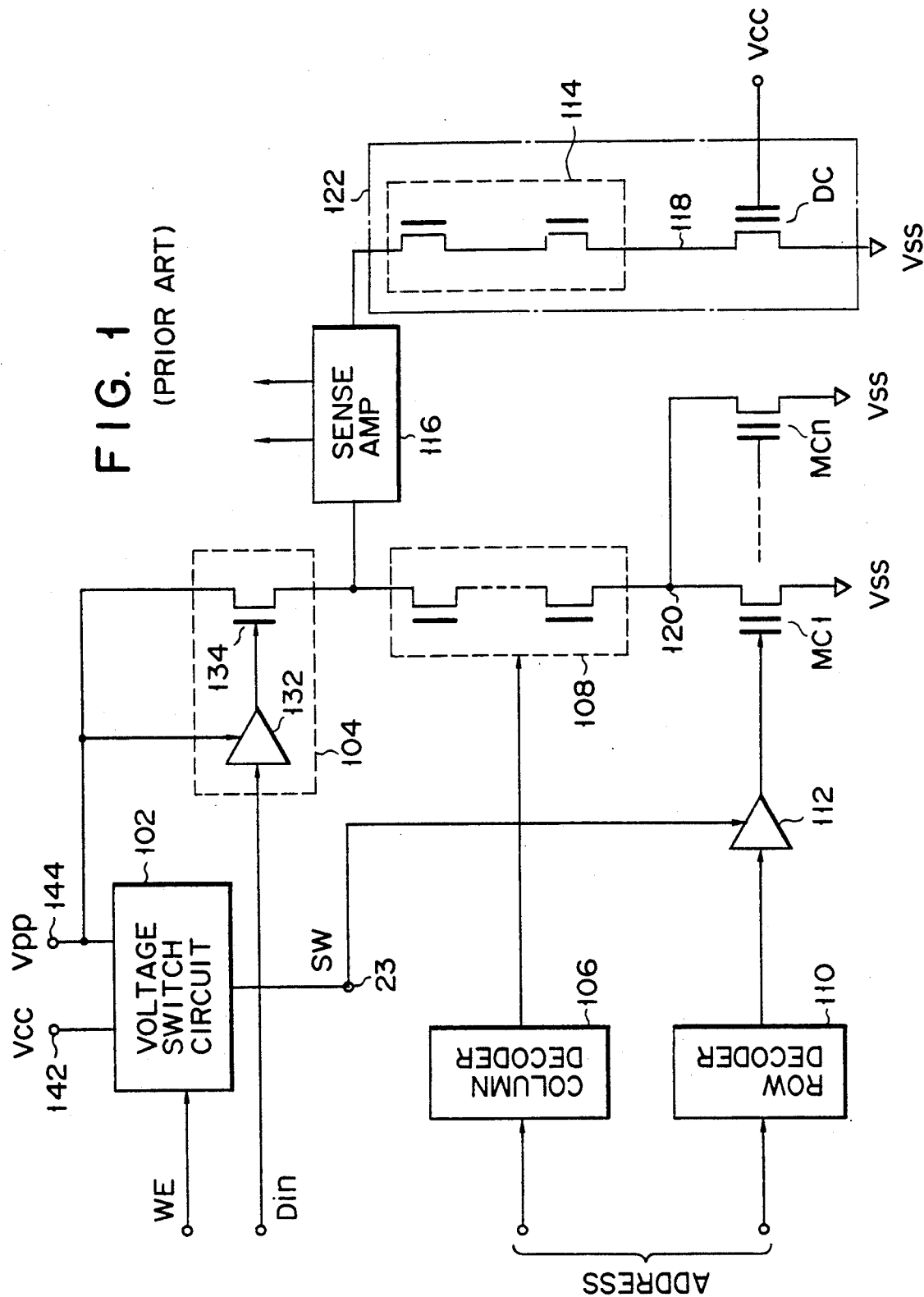
FIG. 1 is a block diagram showing the schematic construction of the conventional EPROM.

There will now be described a semiconductor memory device according to one embodiment of this invention with reference to the accompanying drawings. Portions which are the same as those shown in FIG. 1 are denoted by the same reference numerals and the explanation therefor is omitted.

Figure 5:
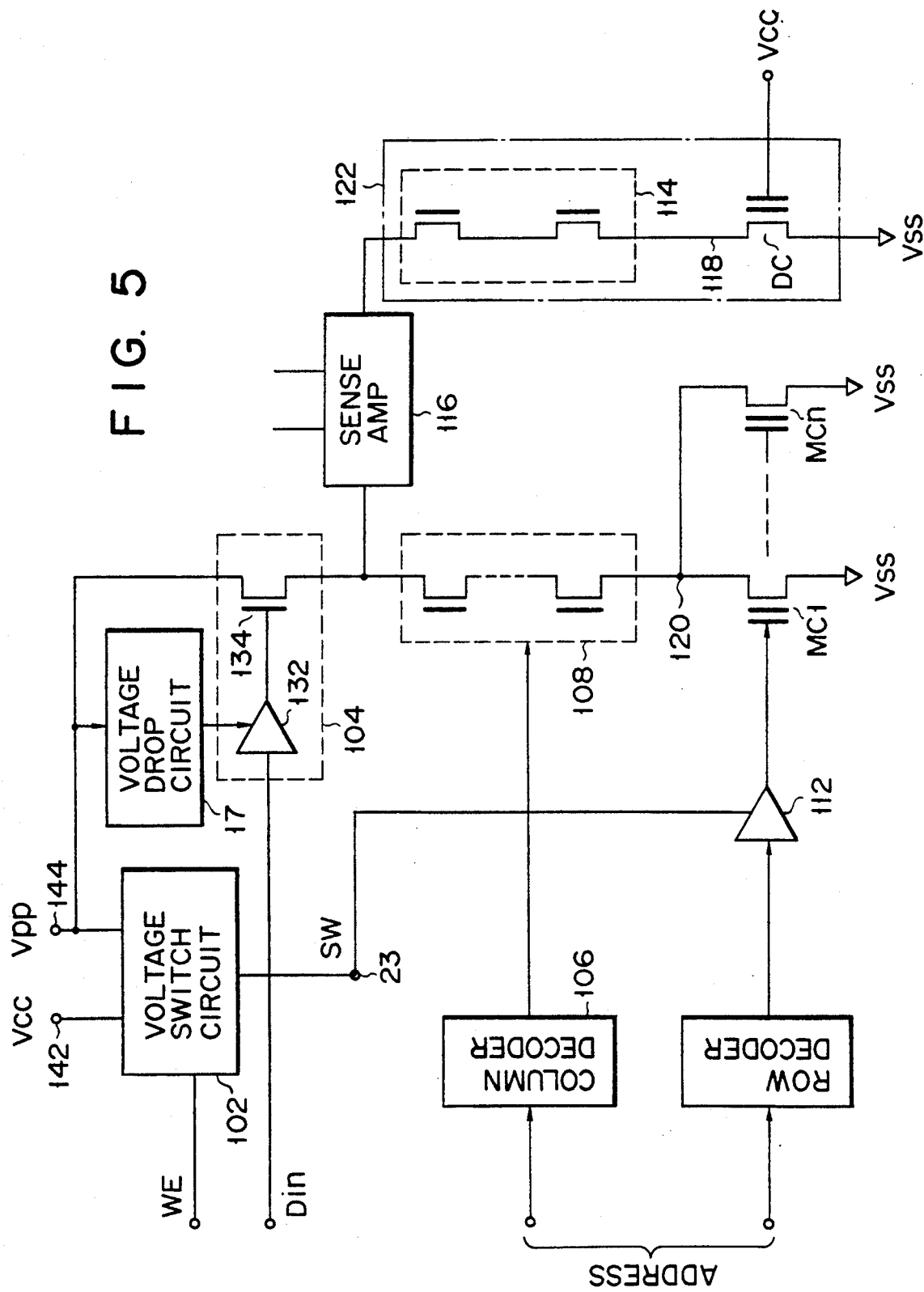
FIG. 5 is a circuit diagram showing the schematic construction of an EPROM according to one embodiment of this invention.

FIG. 5 shows the construction of an EPROM according to one embodiment of this invention. In FIG. 5, ordinary data readout voltage Vcc of 5 V is supplied to power source terminal 142 and high voltage Vpp of, for example, 12.5 V used for data write-in is supplied to power source terminal 144. Each of memory cells MC1 to MCn is a nonvolatile transistor having floating gate 74 and control gate 75. The source of memory cell MC1 is connected to receive reference voltage Vss of 0 V. The drain and source of N-channel MOS transistor 134 for write-in or programming control are respectively connected to power source terminal 144 and column selection circuit 108 including a plurality of N-channel MOS transistors for selecting one of the memory cells. Write-in control buffer 132 supplies a signal corresponding to write-in data Din to the gate of transistor 134. High voltage Vpp is generally 12.5 V. Voltage lowering circuit 17 lowers the voltage supplied to power source terminal 144, i.e. Vpp, by approximately the threshold voltage (Vth) of transistor 21 (FIG. 6) in the voltage lowering circuit 17. Voltage lowering circuit 17 then supplies a voltage Vpp' that is less than Vpp and is approximately equal to Vpp−Vth, to buffer 132 as a power source voltage. Lowered voltage Vpp' will permit the selected memory cell to be data-written, while preventing the charges in the nonselected memory cells from being emitted. Voltage switching circuit 102 supplies one of power source voltages Vcc and Vpp respectively supplied to power source terminals 142 and 144 to row address buffer 112 via node 23 as voltage SW according to input write-in control signal WE.

Figure 4:
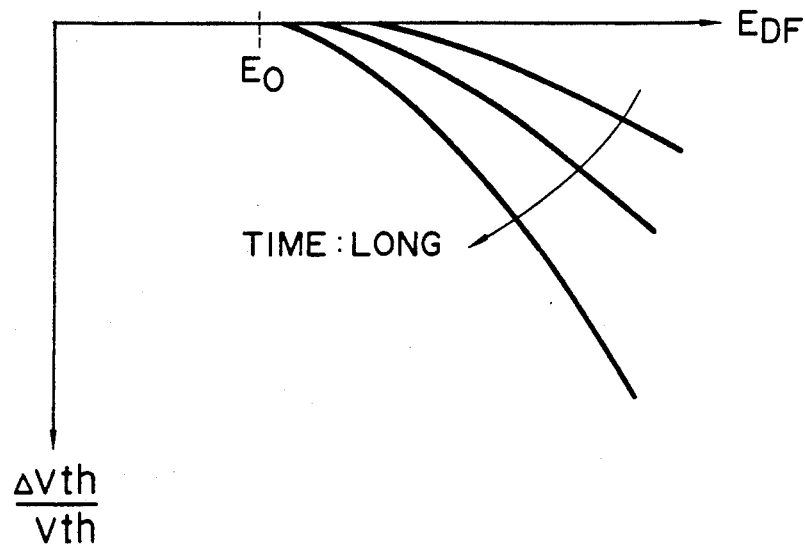
FIG. 4 is a degradation characteristic diagram of the memory cell shown in FIG. 1.

The semiconductor memory device of this invention is based on the following principle. FIG. 4 is a characteristic diagram showing the relation between programming time Tpw in the memory cell constructed by a nonvolatile transistor and variation ΔVth in the threshold voltage and the drain voltage is used as a parameter. Variation ΔVth in the threshold voltage increases as programming time Tpw becomes longer. However, the write-in characteristic may vary according to the drain voltage only when programming time Tpw is equal to or less than preset programming time Tpw0. That is, when programming time Tpw exceeds preset programming time Tpw0, influence of the drain voltage on the write-in characteristic can be neglected. For example, if tox1=200 Å, channel length L=0.9 μm and the drain voltage is set at 6 V or more in the memory cell of the construction shown in FIG. 2, programming time Tpw0 can be set at 1 μS. Therefore, it becomes possible to satisfy Tpw=25 μS which is the standard specification of an EPROM having a memory capacity of 4M bits.

With the above construction, assuming that memory cell MC1 is selected in the data write-in mode, then high voltage Vpp output from row address buffer 112 is applied to control gate 75 of memory cell MC1. At this time, voltage Vpp' which is lower than high voltage Vpp by a preset value, for example, threshold voltage Vth is output from write-in control buffer 132. As a result, a voltage of (Vpp'−Vth) is supplied to column selection gate circuit 108 via transistor 134 and is applied to the drain of memory cell MC1, thereby permitting data to be written or programmed into memory cell MC1.

Voltage (Vpp'−Vth) is also applied to the drains of non-selected memory cells. In this case, voltage (Vpp'−Vth) is so set that electrons will not be emitted from the floating gates of the non-selected memory cells even if voltage (Vpp'−Vth) is applied to the drains of the non-selected memory cells. More specifically, voltage (Vpp'−Vth) is set to be lower than the product of electric field E0 in FIG. 4 and film thickness tox1 of the insulation film in FIG. 2 and set to be higher than the drain voltage which will not degrade the write-in characteristic shown in FIG. 8. As a result, data stored in the non-selected memory cell can be prevented from being degraded by a voltage stress without lowering the readout speed and write-in speed.

FIG. 6 is circuit diagram showing the specific construction of write-in control buffer 132 and power source voltage lowering circuit 17.

As shown in FIG. 6, power source voltage lowering circuit 17 includes voltage lowering N-channel MOS transistor 21, P-channel MOS transistor having a gate supplied with voltage Vcc and bias current setting depletion type MOS transistor 23. MOS transistors 21 and 22 are of enhancement type. MOS transistor 23 permits preset bias current to flow. Since high voltage Vpp is generally 12.5 V and voltage Vcc is generally 5 V, transistor 22 is turned on and, as a result, voltage lowering circuit 17 outputs from the output node 24 voltage Vpp' which is lower than high voltage Vpp by the threshold voltage Vth of transistor 21. Further, since transistor 22 is used in the circuit, flow of a useless current can be prevented by turning off transistor 22 when ordinary power source voltage Vcc is supplied to power source terminal 142.

Write-in control buffer 132 includes CMOS inverter 31 to which voltage Vcc is supplied as a power source voltage, N-channel MOS transistors 34 and 35 series-connected between output node 32 of inverter 31 and node 33 and having respective gates supplied with voltages Vcc and Vpp', P-channel MOS transistor 37 connected between voltage node Vpp' and output node 36 and having a gate connected to node 33, N-channel MOS transistor 38 connected between output node 36 and reference voltage terminal Vss and having a gate connected to node 32, and P-channel MOS transistor 39 connected between voltage node Vpp' and node 33 and having a gate connected to output node 36.

With the above construction, if input data supplied to inverter 31 is logic level "1" of voltage Vcc, node 32 is set to voltage Vss and output node 36 is charged to voltage Vpp' via transistor 37. At this time, a voltage applied to the drain of memory cell MC1 via transistor 134 is set to (Vpp−2Vth) which is lower than voltage Vpp by threshold voltage Vth of transistor 134. In contrast, if input data supplied to inverter 31 is logic level "0", node 32 is set to voltage Vcc and output node 36 is discharged to voltage Vss via transistor 38.

Figure 2:
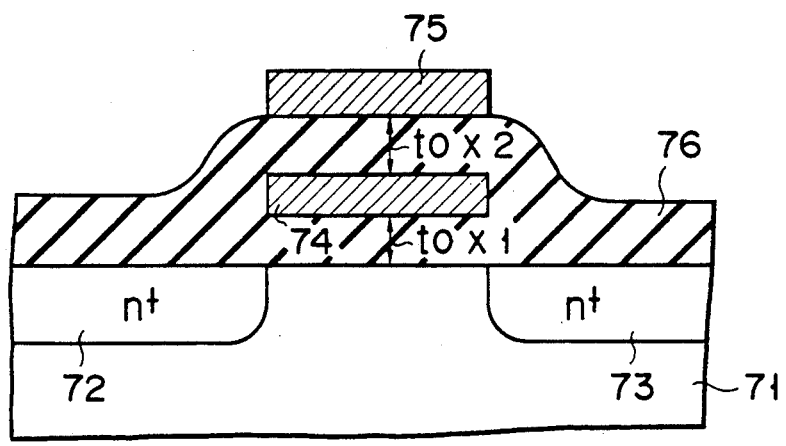
FIG. 2 is a cross sectional view showing the construction of a memory cell shown in FIG. 1.
Figure 3:
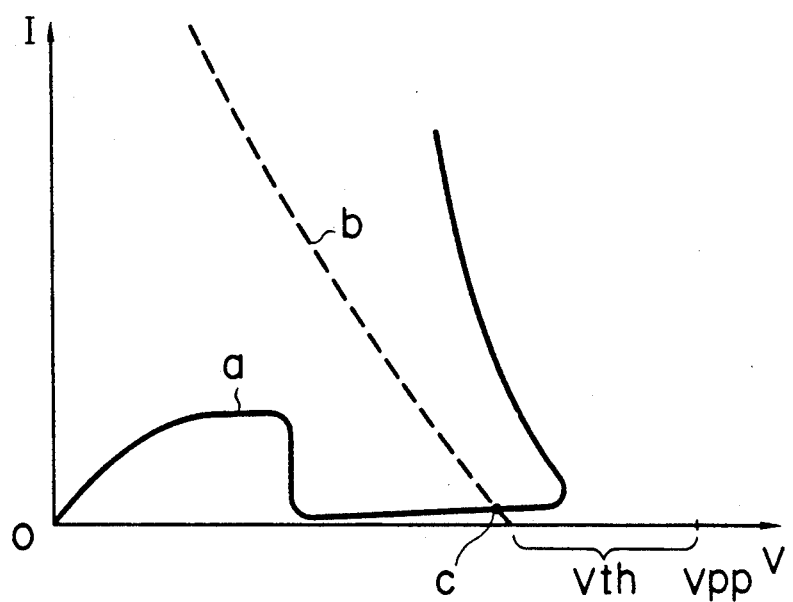
FIG. 3 is an operation characteristic diagram of the memory cell of FIG. 1.

In a case where a write-in current of 16 mA, for example, is supplied and a voltage of 12.5 V is supplied as high voltage Vpp when a voltage of output node 36 of write-in control buffer 132 is set at (Vpp−Vth), a voltage applied to the drain of memory cell MC1 is set to approx. 7 V. Assuming that film thickness tox1 in FIG. 2 is set at 200 Å and programming time Tpw is set at 25 μS, then the voltage of 7 V is sufficiently lower than 8 V at which electrons may start to be emitted by the voltage stress and is sufficiently higher than 6 V at which the drain voltage may affect programming time Tpw. The lower limit of the film thickness of the insulation film in the memory cell which can withstand the drain voltage of (Vpp−Vth) occurring in the write-in mode in the conventional memory cell is approx. 240 Å. However, if the memory cell is formed with such film thickness, a cell current in the readout mode will decrease and the access time will be made longer by about 10 nS.

FIG. 7 shows the construction of a modification of voltage lowering circuit 17. In the circuit of FIG. 7, n N-channel MOS transistors 42 are series-connected between voltage node Vpp and output node 41 at which output voltage Vpp' is derived. With this construction, a voltage lower than voltage Vpp by n×Vth, that is, the total sum of the threshold voltages Vth of n transistors 42 can be obtained.

This invention may be made more effective by using a composite film of, for example, oxide film-nitride film-oxide film (ONO film) as the insulation film of the memory cell. The withstanding voltage of such a composite film is generally higher than that of a single layered film and only a small amount of charges may be moved from the floating gate into the control gate even if a high voltage is applied to the control gate. Therefore, the effect of this invention may become significant when a composite film such as an ONO film is used as insulation film 76 formed between floating gate 74 and control gate 75 of memory cell MC1 in FIG. 2.

What is claimed is:

1. A semiconductor memory device comprising:
   a memory cell constructed by a MOS transistor having a floating gate, a control gate and a drain, for storing data;
   power source switching means for selectively supplying as a power source potential one of first and second power source potentials in accordance with an input write-in control signal;
   a gate potential control circuit for generating a first output in accordance with the power source potential from said power source switching means and supplying a first output to said control gate of said memory cell;
   drain potential control means for generating a second output in accordance with a lowered potential supplied thereto and outputting the second output to said drain of said memory cell; and
   power source potential lowering means for lowering the second power source potential by a preset value to obtain the lowered potential and supplying the lowered potential to said drain potential control means.

2. A device according to claim 1, wherein said power source switching means includes means for selecting as the power source potential the first power source potential in a data readout mode and the second power source voltage in the data write-in mode.

3. A device according to claim 1, wherein said power source potential lowering means includes means for generating the lowered potential which is lower than the second power source potential by a first threshold potential of a MOS transistor.

4. A device according to claim 1, wherein the lowered potential is set to be higher than a second threshold potential which permits electrons to be emitted from the floating gate into said control gate of said memory cell.

5. A device according to claim 1, wherein the lowered potential is set to be higher than a third threshold potential which affects the programming time.

6. A device according to claim 1, wherein said memory cell further includes an insulation film which is formed between said floating gate and said control gate and said insulation film is a composite film of oxide film-nitride film-oxide film.

7. A device according to claim 1, wherein said potential lowering means comprises:
   a first MOS transistor of N-channel enhancement type having a first drain, a first gate and a first source, the first drain and first gate being applied with the second power source potential;
   a second MOS transistor of P-channel enhancement type having a second drain, a second gate supplied with the first power source potential and a second source connected to the first source of said first MOS transistor, for supplying the lowered potential to said drain potential control means; and
   a MOS transistor of a depletion type having a third source connected to the second drain of said second transistor for setting a bias current.

8. A device according to claim 1, wherein said potential lowering means comprises:
   a MOS transistors (n is more than 1 and an integer) connected in series to one another, a drain of a first-stage transistor of said n MOS transistors being supplied with the second power source potential and a lowered potential being derived from a source of the last-stage transistor of said n MOS transistors.

9. A method for preventing data stored in a nonselected memory cell from being degraded in a semiconductor memory device comprising the steps of:
   supplying a power source potential to the control gate of a selected memory cell of a plurality of memory cells in the write mode;
   lowering the power source potential by a preset value to obtain a lowered potential; and
   supplying the lowered potential to the drains of said plurality of memory cells.

10. A method according to claim 9, wherein
    the step of lowering the power source potential includes a step of obtaining a potential which is lower than the power source potential by the threshold potential of a MOS transistor or more.

11. A method according to claim 9, wherein the lowered potential is set to be higher than a threshold potential which permits electrons to be emitted from the floating gate into the control gate.

12. A method according to claim 9, wherein the lowered potential is set to be higher than a threshold potential which affects the programming time of the selected memory cell.

13. A method according to claim 9, wherein an insulation film which is a composite film of oxide film-nitride film-oxide film is formed between the floating gate and the control gate.

* * * * *